US012787750B2

(12) United States Patent
Kendrick et al.

(10) Patent No.: US 12,787,750 B2
(45) Date of Patent: Nov. 3, 2026

(54) MESHED TRANSMISSION LINE

(71) Applicant: NORTHROP GRUMMAN SYSTEMS CORPORATION, Falls Church, VA (US)

(72) Inventors: Nyle Lee Kendrick, Baltimore, MD (US); Joshua A. Strong, Ellicott City, MD (US); Haitao O. Dai, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 434 days.

(21) Appl. No.: 18/510,319

(22) Filed: Nov. 15, 2023

(65) Prior Publication Data

US 2025/0157920 A1 May 15, 2025

(51) Int. Cl.

*H10W 20/43* (2026.01)
*H10W 20/41* (2026.01)
*H10W 20/44* (2026.01)

(52) U.S. Cl.

CPC ......... *H10W 20/43* (2026.01); *H10W 20/423* (2026.01); *H10W 20/4484* (2026.01)

(58) Field of Classification Search

CPC .......................... H10W 20/43; H10W 20/423; H10W 20/4484

See application file for complete search history.

(56) References Cited

U.S. PATENT DOCUMENTS

| | | | | |
|---|---|---|---|---|
| 6,184,477 | B1 * | 2/2001 | Tanahashi ............ | H05K 1/0253 257/E23.079 |
| 10,133,299 | B1 | 11/2018 | Strong et al. | |
| 10,591,952 | B1 | 3/2020 | Strong et al. | |
| 2007/0152307 | A1 * | 7/2007 | Mizuno .................. | H01P 3/081 257/663 |
| 2020/0013714 | A1 * | 1/2020 | Lin ........................ | H10D 1/714 |

OTHER PUBLICATIONS

Klumperink, et al.: "Transmission Lines in CMOS: An Explorative Study"; 12th Annual Workshop on Circuits, Systems and Signal Processing, Veldhove/Netherlands (2001), pp. 440-445.

MITTAL: "What is a PCB Transmission Line?" found on the internet on Jun. 15, 2023 at: https://www.protoexpress.com/blog/pcb-transmission-line/.

Amakawa, et al.: "Highly Energy-Efficient On-Chip Pulsed-Current-Mode Transmission Line Interconnect"; ResearchGate, Chapter—Jan. 2010; DOI: 105772/6884—Source: InTech.

* cited by examiner

*Primary Examiner* — Allison Bernstein

(74) *Attorney, Agent, or Firm* — Renner Otto Boisselle Sklar LLP; Christopher P. Harris

(57) ABSTRACT

An integrated circuit (IC) includes a first metal layer that provides a signal layer. The IC furthermore includes a second metal layer spaced apart from the first metal layer by a gap, the second metal layer providing a ground plane. A meshed signal line including one or more holes is disposed in the first metal layer and the meshed signal line is configured to transmit a received signal between circuits on the IC.

17 Claims, 8 Drawing Sheets

MESHED TRANSMISSION LINE

GOVERNMENT INTEREST

The invention was made under Government Contract. Therefore, the US Government has rights to the invention as specified in that contract.

TECHNICAL FIELD

The present invention relates generally to signal transmission in integrated circuits (ICs), and more particularly to a meshed transmission line.

BACKGROUND

A transmission line is a set of conductors used for transmitting a signal between a source and a destination. For integrated circuits, with the large number of circuit components that can be integrated on a chip, construction of on-chip interconnects/transmission lines is essential. However, if not properly designed, the on-chip transmission lines can lead to power dissipation. Power dissipation in the on-chip transmission lines is proportional to signal frequency and with the signal frequencies going up, proper design of on-chip transmission lines is extremely important to reduce power dissipation. Furthermore, signal reflections, crosstalk, and electromagnetic noise will occur if the impedance of the on-chip transmission line is not controlled.

SUMMARY

In one example, an integrated circuit (IC) includes a first metal layer that provides a signal layer. The IC furthermore includes a second metal layer spaced apart from the first metal layer by a gap, the second metal layer providing a ground plane. A meshed signal line including one or more holes is disposed in the first metal layer and the meshed signal line is configured to transmit a received signal between circuits on the IC.

In another example, an electronic device includes a first metal layer that provides a signal layer. The electronic device furthermore includes a second metal layer spaced apart from the first metal layer by a gap, the second metal layer providing a meshed ground plane. A meshed signal line including one or more holes is disposed in the first metal layer and the meshed signal line is configured to transmit a received signal between circuits of the electronic device. The dimensions of the one or more holes of the meshed signal line are smaller than a wavelength of the received signal transmitted through the meshed signal line.

DETAILED DESCRIPTION

Figure 1:
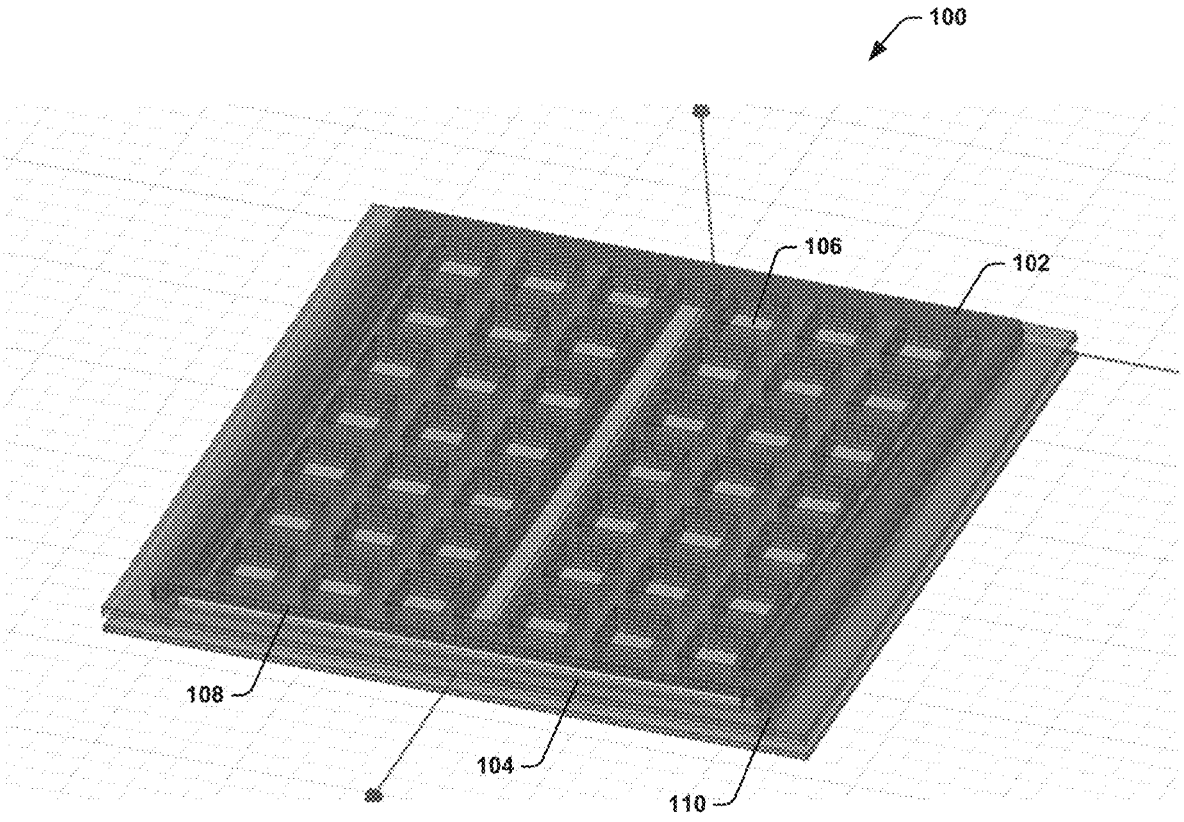
FIG. 1 illustrates a portion of an integrated circuit (IC).

The present disclosure relates generally to transmission lines in integrated circuits (ICs), and more particularly to a meshed transmission line that includes one or more holes. To deliver power to multiple chips on a multi-chip module (MCM) with good amplitude uniformity, low impedance transmission lines are required. The impedance of a transmission line is given by:

$$z = \sqrt{\frac{L}{C}} \tag{1}$$

where Z is the impedance of the transmission line, L is the inductance of the transmission line and C is the capacitance of the transmission line.

For a wide transmission line:

$$\text{Inductance per length: } L \approx \mu_{eff}\frac{d}{w} \tag{2}$$

where, w is transmission line width, d is dielectric thickness and $\mu_{eff}$ is effective permeability.

$$\text{Capacitance per length: } C \approx \epsilon_{eff}\frac{w}{d} \tag{3}$$

where, w is transmission line width, d is dielectric thickness and $\in_{eff}$ is effective dielectric constant.

Substituting equations (2) and (3) in equation (1), we get, $$\text{Impedance: } Z = \sqrt{\frac{L}{C}} \propto \frac{d}{w} \tag{4}$$

From equation (4), the impedance of the transmission line Z is inversely proportional to the width w of the transmission line.

Therefore, to achieve the desired impedance (e.g., low impedance), wide transmission lines (e.g., with widths in the excess of 20 um wide) are needed. Solid transmission lines that are too wide are subject to dishing and other fabrication problems. The increased metal density in the vicinity of the wide solid transmission lines increases the complexity of the manufacturing process which increases the cost and risks. To meet the fabrication density requirements, the density of transmission lines must be kept low, for example, between 35% and 60% relative to a solid transmission line.

To overcome the above disadvantages, a low impedance and low-density transmission line is proposed herein. In particular, a meshed transmission line that includes a meshed signal line having one or more holes is proposed. The meshed signal line is configured to transmit or propagate a received signal (e.g., in the frequency range of 1-10 GHZ) associated with an integrated circuit (IC). What is meant by the meshed signal line being configured to transmit or propagate a received signal is that is the meshed signal line is configured to propagate a signal received from a device connected to a first end of the meshed signal line to a device connected to a second end of the meshed signal line. The meshed signal line is disposed in a metal layer associated with the IC. The meshed signal line includes one or more holes (e.g., etched thereto). In some examples, the one or more holes in the meshed signal line enables a reduction of density of the meshed signal line, while maintaining a width that is required to achieve the low impedance. The dimensions of the one or more holes of the meshed signal line are designed to be much smaller (e.g., 1000-10000 times smaller) than a wavelength of the signal transmitted or propagated through the meshed signal line. In some examples, designing the dimensions of the one or more holes of the meshed signal line to be smaller than the wavelength of the propagated signal prevents the signal from leaking through the one or more holes. In some examples, the holes are ~1 um across, and the wavelength of the signal is typically ~1-10 mm.

In some examples, the meshed transmission line furthermore includes an upper ground plane that is provided by another metal layer of the IC. The upper ground plane is located above the meshed signal line and is configured to act as a circuit ground. In some examples, the upper ground plane also includes one or more holes associated therewith. Furthermore, in some examples, the meshed transmission line includes a lower ground plane that is provided by a yet another metal layer of the IC. The lower ground plane is located below the meshed signal line and is configured to act as a circuit ground. In some examples, the lower ground plane also includes one or more holes associated therewith. The dimensions of the one or more holes of the upper ground plane and the lower ground plane are designed to be much smaller (e.g., 1000-10000 times smaller) than a wavelength of the signal transmitted through the meshed signal line. In some examples, designing the dimensions of the one or more holes of the upper ground plane and the lower ground plane to be smaller than the wavelength of the transmitted or propagated signal prevents the signal from leaking through the one or more holes.

By utilizing the meshed structure (e.g., by etching holes) for the signal line and/or the ground planes, the manufacturability of the transmission line (e.g., the meshed transmission line) is improved, which in turn reduces the risk of chip failure. Furthermore, utilizing the meshed structure improves the yield by reducing the density of the transmission line to utilize less materials, which in turn reduce costs and increase repeatability as less material is needed for the transmission line to be replicated. In some examples, using two ground planes, one above the meshed signal line and the other below the meshed signal line increases the capacitance associated with the meshed transmission line, which in turn enables the reduction of the impedance associated with the meshed transmission line (e.g., based on equation (1) above). In some examples, using the upper ground plane and/or the lower ground plane furthermore enables shields the meshed signal line from signals from other parts of the integrated circuit. In some examples, the meshed transmission line proposed herein is used in superconducting circuits/systems.

FIG. 1 illustrates a portion of an integrated circuit (IC) 100. In some examples, the integrated circuit 100 may be a superconducting circuit. Furthermore, in some examples, the integrated circuit 100 may be an electronic device that includes one or more ICs coupled together or an IC and other components configured to operate together. The integrated circuit 100 includes a meshed transmission line 102 configured to transmit a signal between circuits on the IC 100. It is noted herein that the IC 100 may include a plurality of meshed transmission lines, however, only a single meshed transmission line 102 is shown herein for clarity. The meshed transmission line 102 includes a meshed signal line 104 that includes one or more holes 106 etched thereto. In this example, the meshed signal line 104 is shown to include a plurality of square shaped holes and a rectangle shaped hole. However, in other examples, the shapes of the one or more holes 106 can be different, for example, circle, hexagon etc.

The meshed signal line 104 is disposed in (or formed in) a first metal layer associated with the IC 100. In some examples, the first metal layer of the IC 100 provides a signal layer (or an active layer) that includes a plurality of circuits associated with the IC 100 and the meshed signal line 104 is a part of the first metal layer. In some examples, the meshed signal line 104 is configured to transmit a signal between circuits on the signal layer. In some examples, dimensions (e.g., length, breadth, depth, diameter etc.) of the one or more holes 106 of the meshed signal line 104 are much smaller (e.g., 1000-10000 times smaller) than a wavelength of the signal the meshed signal line 104 transmits. In other words, the dimensions of each hole of the one or more holes 106 of the meshed signal line 104 are smaller than a wavelength of the signal the meshed signal line 104 transmits.

The meshed transmission line 102 furthermore includes one or more ground planes associated therewith that act as circuit ground. In some examples, the one or more ground planes may include a meshed ground plane that includes one or more holes associated therewith. In this example, the meshed transmission line 102 includes an upper ground plane 108 and a lower ground plane 110. However, in other examples, the meshed transmission line 102 can include just one ground plane, that is, either the upper ground plane 108 or the lower ground plane 110, and not both. The upper ground plane 108 is provided by a second metal layer associated with the IC 100. In some examples, the upper ground plane 108 includes a part of the second metal layer. Alternately, in other examples, the upper ground plane 108 extends through the entire second metal layer.

The second metal layer is located above the first metal layer (that includes the meshed signal line 104) and the second metal layer is spaced apart from the first metal layer by a gap. In this example, the gap is defined/formed by a dielectric layer disposed between the first metal layer and the second metal layer. Alternately, in other examples, the gap may be an air gap defined/formed by bump bonds or posts coupling the first metal layer to the second metal layer. The upper ground plane 108 overlaps the meshed signal line 104. In this example, the upper ground plane 108 forms a meshed upper ground plane 108 including one or more holes 106 etched thereto. Alternately, in other examples, the upper ground plane 108 includes a solid continuous structure with no holes. It is noted herein that the same numbering 106 is utilized for the one or more holes associated with the meshed signal line 104, the meshed upper ground plane 108 and the meshed lower ground plane 110, for ease of reference. In this example, the meshed upper ground plane 108 is shown to include a plurality of square shaped holes and a rectangle shaped hole.

However, in other examples, the shapes of the one or more holes 106 can be different, for example, circle, hexagon etc. In some examples, the shapes of the one or more holes 106 of the meshed upper ground plane 108 is same as the shapes of the one or more holes 106 of the meshed signal line 104. Alternately, in other examples, the shapes of the one or more holes 106 of the meshed upper ground plane 108 may be different from the shapes of the one or more holes 106 of the meshed signal line 104. The one or more holes 106 of the meshed upper ground plane 108 is aligned with the one or more holes 106 of the meshed signal line 104. The dimensions (e.g., the length, breadth, depth, diameter etc.) of each hole of the one or more holes 106 of the meshed upper ground plane 108 are smaller than a wavelength of the signal the meshed signal line 104 transmits.

The lower ground plane 110 is provided by a third metal layer associated with the IC 100. In some examples, the lower ground plane 110 includes a part of the third metal layer. Alternately, in other examples, the lower ground plane 110 extends through the entire third metal layer. The third metal layer is located below the first metal layer (that includes the meshed signal line 104) and the third metal layer is spaced apart from the first metal layer by a gap. In this example, the is defined/formed by a dielectric layer disposed between the first metal layer and the third metal layer. Alternately, in other examples, the gap may be an air gap defined/formed by bump bonds or posts coupling the first metal layer to the third metal layer. The lower ground plane 110 overlaps the meshed signal line 104. In this example, the lower ground plane 110 forms a meshed lower ground plane 110 including one or more holes 106 etched thereto.

Alternately, in other examples, the lower ground plane 110 includes a solid continuous structure with no holes. In this example, the meshed lower ground plane 108 is shown to include a plurality of square shaped holes and a rectangle shaped hole. However, in other examples, the shapes of the one or more holes 106 can be different, for example, circle, hexagon etc. In some examples, the shapes of the one or more holes 106 of the meshed lower ground plane 110 is same as the shapes of the one or more holes 106 of the meshed signal line 104. Alternately, in other examples, the shapes of the one or more holes 106 of the meshed lower ground plane 110 may be different from the shapes of the one or more holes 106 of the meshed signal line 104. The one or more holes 106 of the meshed lower ground plane 110 is aligned with the one or more holes 106 of the meshed signal line 104. The dimensions (e.g., the length, breadth, depth, diameter etc.) of each hole of the one or more holes 106 of the meshed lower ground plane 110 are smaller than a wavelength of the signal transmitted or propagated through the meshed signal line 104.

It is noted herein that the terms first, second and third with reference to the metal layers are used herein not to establish an ordinal relationship, but just for distinction purposes. In some examples, the dielectric layer disposed between the first metal layer and the second metal layer has one or more holes associated therewith. In such examples, the one or more holes of the dielectric layer are aligned with the one or more holes 106 of the first metal layer and the one or more holes 106 of the second metal layer. Similarly, in some examples, the dielectric layer disposed between the first metal layer and the third metal layer has one or more holes associated therewith. In such examples, the one or more holes of the dielectric layer are aligned with the one or more holes 106 of the first metal layer and the one or more holes 106 of the third metal layer. In some examples, the first metal layer, the second metal layer and the third metal layer are formed from superconductor materials like niobium, aluminum, tantalum etc.

Figure 2:
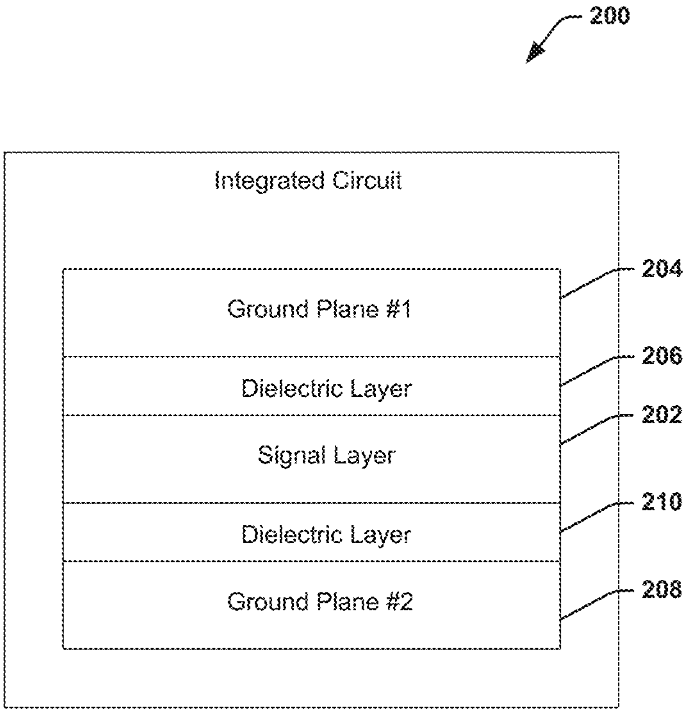
FIG. 2 illustrates a simplified block diagram of an integrated circuit (IC) that includes a meshed transmission line.

FIG. 2 illustrates a simplified block diagram of an integrated circuit (IC) 200 that includes a meshed transmission line (e.g., the meshed transmission line 102 in FIG. 1). In some examples, the IC 200 is similar to the IC 100 in FIG. 1. The IC 200 includes a signal layer 202 that includes a plurality of circuits associated with the IC 200. The signal layer 202 is provided by a first metal layer associated with the IC 200. In some examples, the signal layer 202 (or the first metal layer) includes a meshed signal line (e.g., the meshed signal line 104 in FIG. 1). The meshed signal line may be only a part of the signal layer 202. All the features of the meshed signal line 104 in FIG. 1 are also applicable to the meshed signal line in FIG. 2. The IC 200 furthermore includes a first ground plane 204 that overlaps the signal layer 202 (in particular, overlaps the meshed signal line disposed in the signal layer 202). The first ground plane 204 is provided by a second metal layer associated with the IC 200. In some examples, the first ground plane 204 includes the entire second metal layer of the IC 200. Alternately, in other examples, the first ground plane 204 is only a part of the second metal layer. The first ground plane 204 is located above the signal layer 202 and is spaced apart from the signal layer 202 by a dielectric layer 206 associated with the IC 200.

In some examples, the first ground plane 204 includes a dedicated ground plane associated with the IC 200. In such examples, the second metal layer (that provides the first ground plane 204) includes a metal layer that is dedicated to form a ground plane associated with the IC 200. Alternately, in other examples, second metal layer may include any intermediate metal layer (that is not dedicated to form a ground plane) associated with the IC 200 and the first ground plane 204 may be coupled to the dedicated ground plane of the IC 200. In some examples, the first ground plane 204 may include a meshed ground plane including one or more holes associated therewith. Alternately, in other examples, the first ground plane 204 may include a solid continuous structure with no holes. In particular, in examples where the first ground plane 204 includes the dedicated ground plane, the first ground plane 204 may include a solid continuous structure. Furthermore, in examples where the first ground plane 204 is provided by an intermediate metal layer (that is not dedicated to form a ground plane), the first ground plane 204 may include one or more holes associated therewith.

Furthermore, the IC 200 includes a second ground plane 208 that overlaps the signal layer 202 (in particular, overlaps the meshed signal line disposed in the signal layer 202). The second ground plane 208 is provided by a third metal layer associated with the IC 200. In some examples, the second ground plane 208 includes the entire third metal layer of the IC 200. Alternately, in other examples, the second ground plane 208 is only a part of the third metal layer. The second ground plane 208 is located below the signal layer 202 and is spaced apart from the signal layer 202 by a dielectric layer 210 associated with the IC 200.

In some examples, the second ground plane 208 includes a dedicated ground plane associated with the IC 200. In such examples, the third metal layer (that provides the second ground plane 208) includes a metal layer that is dedicated to form a ground plane associated with the IC 200. Alternately, in other examples, third metal layer may include any intermediate metal layer (that is not dedicated to form a ground plane) associated with the IC 200 and the second ground plane 208 may be coupled to the dedicated ground plane of the IC 200. In some examples, the second ground plane 208 may include a meshed ground plane including one or more holes associated therewith. Alternately, in other examples, the second ground plane 208 may include a solid continuous structure with no holes. In particular, in examples where the second ground plane 208 includes the dedicated ground plane, the second ground plane 208 may include a solid continuous structure. Furthermore, in examples where the second ground plane 208 is provided by an intermediate metal layer (that is not dedicated to form a ground plane), the second ground plane 208 may include one or more holes associated therewith. In some examples, providing holes on the ground planes formed in the intermediate layers of the IC 200 enables to reduce fabrication issues by reducing density. In this example, the meshed signal line included in the signal layer 202, the first ground plane 204 and the second ground plane 208 together forms the meshed transmission line (e.g., the meshed transmission line 102 in FIG. 1). Apart from the layers shown herein, the IC 200 may include additional layers.

Figure 3:
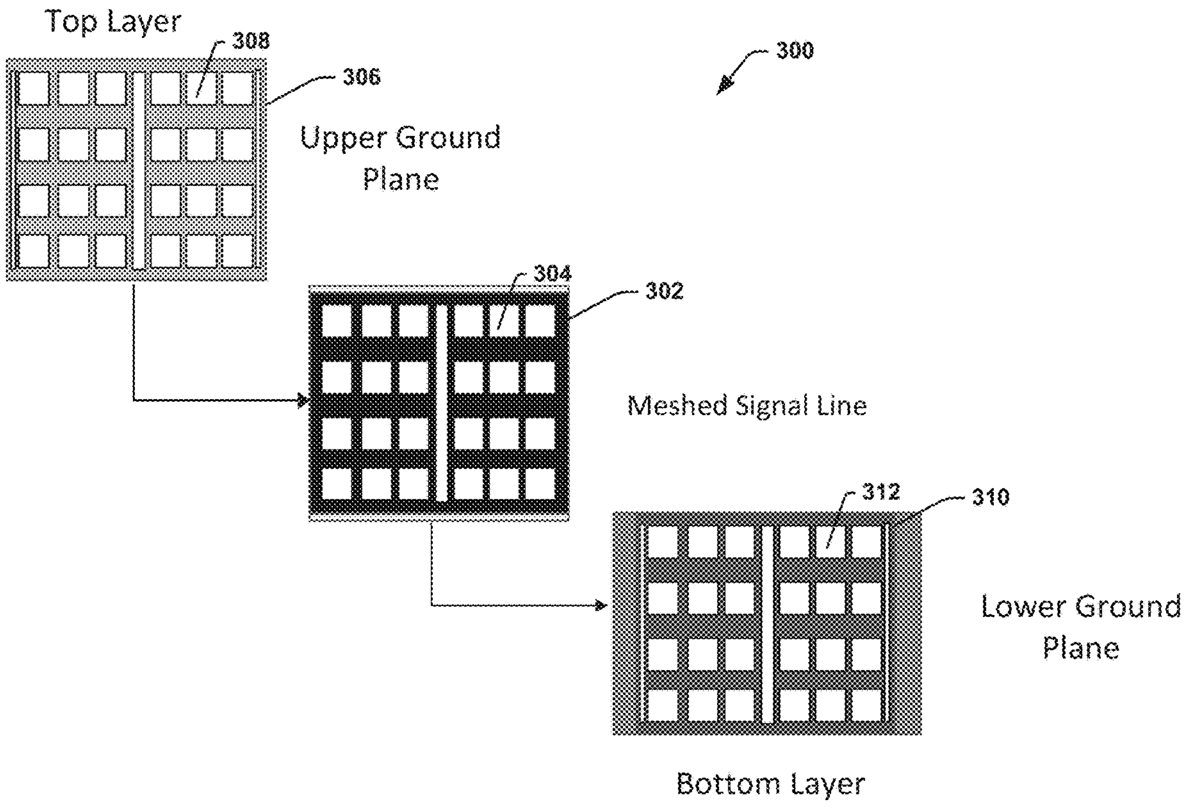
FIG. 3 depicts an example illustration of a meshed transmission line with two meshed ground planes.

FIG. 3 depicts an example illustration of a meshed transmission line 300 with two meshed ground planes. The meshed transmission line 300 is part of an integrated circuit (IC). The meshed transmission line 300 includes a meshed signal line 302. The meshed signal line 302 is disposed in a first metal layer associated with the IC. The meshed signal line 302 includes a plurality of holes 304 associated therewith. The meshed transmission line 300 furthermore includes an upper ground plane 306 located above the meshed signal line 302. The upper ground plane 306 is provided by a second metal layer associated with the IC. The meshed signal line 302 and the upper ground plane 306 overlap one another. The upper ground plane 306 includes a meshed upper ground plane including a plurality of holes 308. Furthermore, the meshed transmission line 300 includes a lower ground plane 310 located below the meshed signal line 302. The lower ground plane 310 is provided by a third metal layer associated with the IC. The lower ground plane 310 and the meshed signal line 302 overlap one another. The lower ground plane 310 includes a meshed lower ground plane including a plurality of holes 312. Although not shown, the meshed signal line 302 and the upper ground plane 306 may be separated by a dielectric layer disposed therebetween. Similarly, the meshed signal line 302 and the lower ground plane 310 may be separated by a dielectric layer disposed therebetween.

Figure 4:
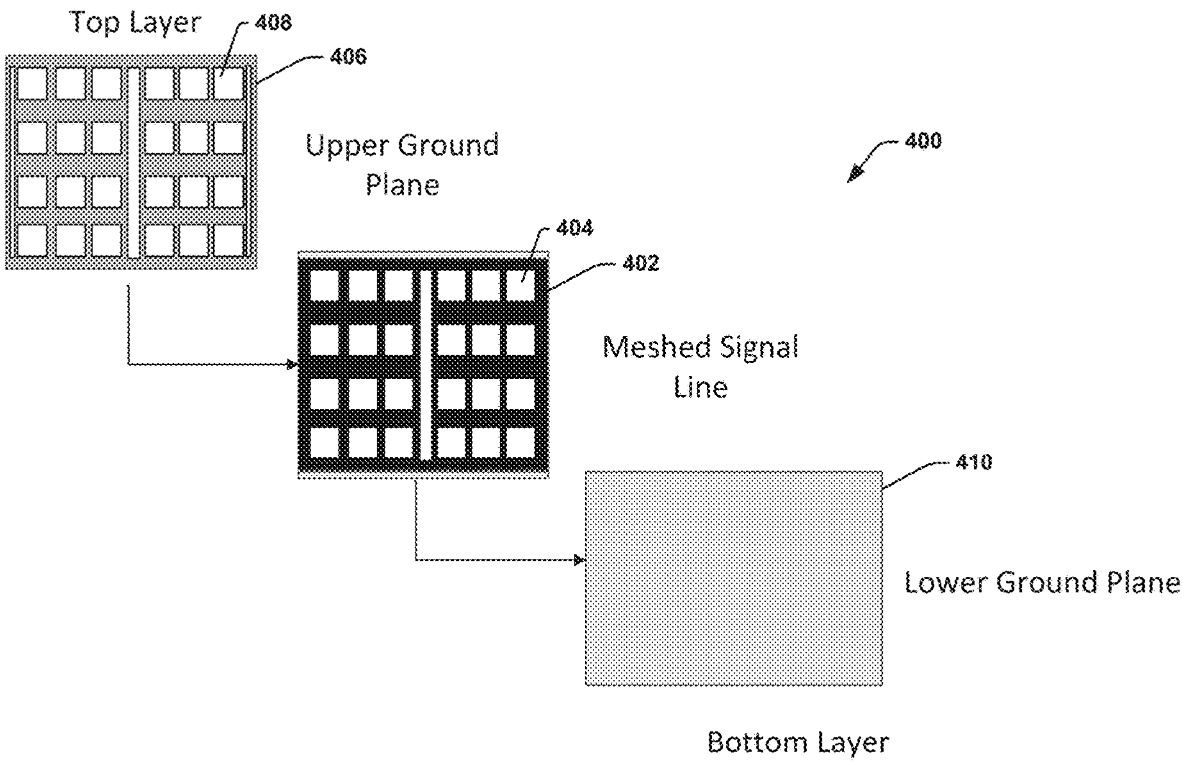
FIG. 4 depicts an example illustration of a meshed transmission line with one meshed ground plane and one ground plane with a solid continuous structure.

FIG. 4 depicts an example illustration of a meshed transmission line 400 with one meshed ground plane and one ground plane with a solid continuous structure. The meshed transmission line 400 is part of an integrated circuit (IC). The meshed transmission line 400 includes a meshed signal line 402. The meshed signal line 402 is disposed in a first metal layer associated with the IC. The meshed signal line 402 includes a plurality of holes 404 associated therewith. The meshed transmission line 400 furthermore includes an upper ground plane 406 located above the meshed signal line 402. The upper ground plane 406 is provided by a second metal layer associated with the IC. The meshed signal line 402 and the upper ground plane 406 overlap one another. The upper ground plane 406 includes a meshed upper ground plane including a plurality of holes 408. Furthermore, the meshed transmission line 400 includes a lower ground plane 410 located below the meshed signal line 402. The lower ground plane 410 is provided by a third metal layer associated with the IC. The lower ground plane 410 and the meshed signal line 402 overlap one another. The lower ground plane 410 includes a solid continuous structure. Although not shown, the meshed signal line 402 and the upper ground plane 406 may be separated by a dielectric layer in between. Similarly, the meshed signal line 402 and the lower ground plane 410 may be separated by a dielectric layer in between.

Figure 5:
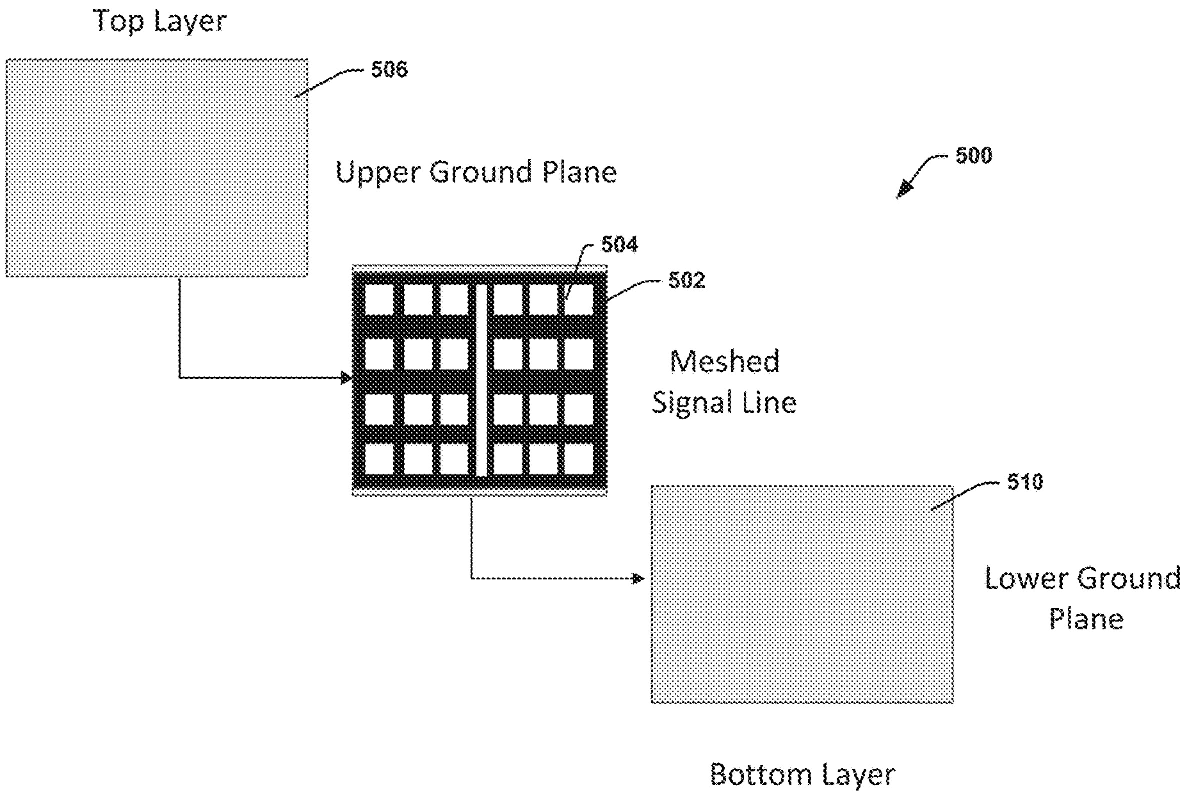
FIG. 5 depicts an example illustration of a meshed transmission line with two ground planes having solid continuous structure.

FIG. 5 depicts an example illustration of a meshed transmission line 500 with two ground planes having solid continuous structure. The meshed transmission line 500 is part of an integrated circuit (IC). The meshed transmission line 500 includes a meshed signal line 502. The meshed signal line 502 is disposed in a first metal layer associated with the IC. The meshed signal line 502 includes a plurality of holes 504 associated therewith. The meshed transmission line 500 furthermore includes an upper ground plane 506 located above the meshed signal line 502. The upper ground plane 506 is provided by a second metal layer associated with the IC. The meshed signal line 502 and the upper ground plane 506 overlap one another. The upper ground plane 506 includes a solid continuous structure. Furthermore, the meshed transmission line 500 includes a lower ground plane 510 located below the meshed signal line 502. The lower ground plane 510 is provided by a third metal layer associated with the IC. The lower ground plane 510 and the meshed signal line 502 overlap one another. The lower ground plane 510 includes a solid continuous structure. Although not shown, the meshed signal line 502 and the upper ground plane 506 may be separated by a dielectric layer in between. Similarly, the meshed signal line 502 and the lower ground plane 510 may be separated by a dielectric layer in between.

Figure 6:
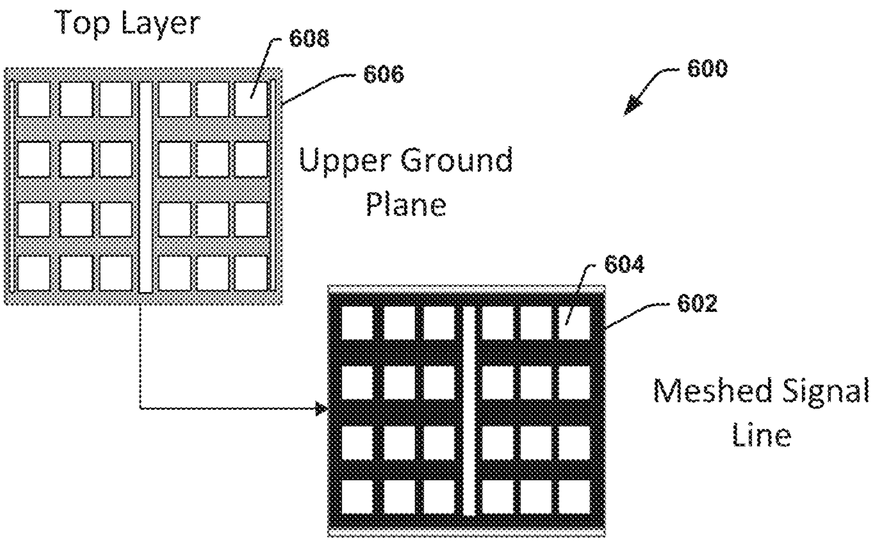
FIG. 6 depicts an example illustration of a meshed transmission line with one meshed ground plane.

FIG. 6 depicts an example illustration of a meshed transmission line 600 with one meshed ground plane. The meshed transmission line 600 is part of an integrated circuit (IC). The meshed transmission line 600 includes a meshed signal line 602. The meshed signal line 602 is disposed in a first metal layer associated with the IC. The meshed signal line 602 includes a plurality of holes 604 associated therewith. The meshed transmission line 600 furthermore includes an upper ground plane 606 located above the meshed signal line 602. The upper ground plane 606 is provided by a second metal layer associated with the IC. The meshed signal line 602 and the upper ground plane 606 overlap one another. The upper ground plane 606 includes a meshed upper ground plane including a plurality of holes 608. Although not shown, the meshed signal line 602 and the upper ground plane 606 may be separated by a dielectric layer in between.

Figure 7:
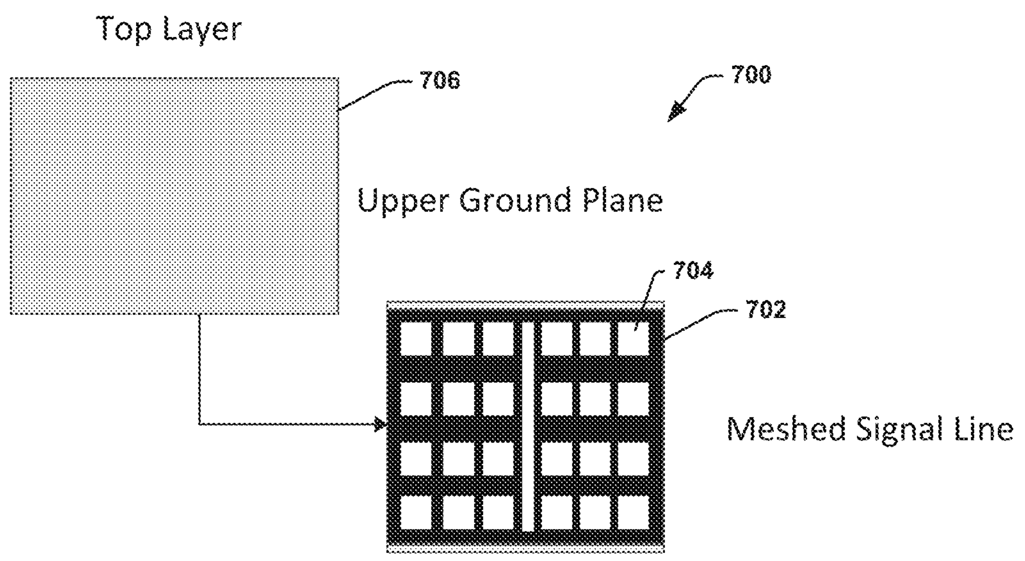
FIG. 7 depicts an example illustration of a meshed transmission line with one ground plane having a solid continuous structure.

FIG. 7 depicts an example illustration of a meshed transmission line 700 with one ground plane having a solid continuous structure. The meshed transmission line 700 is part of an integrated circuit (IC). The meshed transmission line 700 includes a meshed signal line 702. The meshed signal line 702 is disposed in a first metal layer associated with the IC. The meshed signal line 702 includes a plurality of holes 704 associated therewith. The meshed transmission line 700 furthermore includes an upper ground plane 706 located above the meshed signal line 702. The upper ground plane 706 is provided by a second metal layer associated with the IC. The meshed signal line 702 and the upper ground plane 706 overlap one another. The upper ground plane 706 includes a solid continuous structure. Although not shown, the meshed signal line 702 and the upper ground plane 706 may be separated by a dielectric layer in between.

Figure 8A:
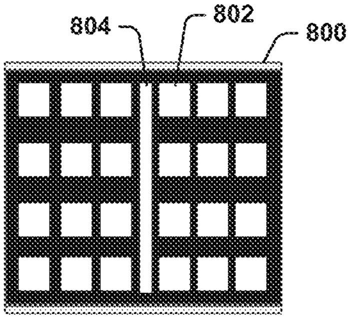
FIG. 8A, FIG. 8B and FIG. 8C illustrate three different meshed signal lines, each having a different shape for the holes associated therewith.
Figure 8B:
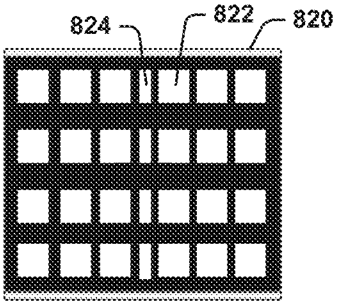
Figure 8C:
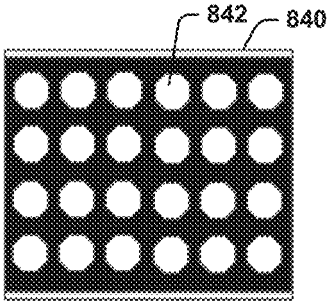

FIG. 8A, FIG. 8B and FIG. 8C illustrate three different meshed signal lines, each having a different shape for the holes associated therewith. In particular, FIG. 8A illustrates a meshed signal line 800 having a plurality of square shaped holes 802 and a rectangle shaped hole 804. Furthermore, FIG. 8B illustrates a meshed signal line 820 having a first plurality of square shaped holes 822 and a second plurality of rectangle shaped holes 824. Furthermore, FIG. 8C illustrates a meshed signal line 840 having a plurality of octagon shaped holes 842. In addition, in other examples, the meshed signal line can have other shapes for holes, for example, circle, hexagon etc. Although not illustrated herein, ground planes (e.g., the upper ground plane, the lower ground plane etc.) can also have holes in shapes as illustrated in FIG. 8A, FIG. 8B and FIG. 8C. Further, in other examples, the ground planes can have holes in other shapes as well, for example, circle, hexagon etc.

What have been described above are examples of the invention. It is, of course, not possible to describe every conceivable combination of components or methodologies for purposes of describing the invention, but one of ordinary skill in the art will recognize that many furthermore combinations and permutations of the invention are possible. Accordingly, the invention is intended to embrace all such alterations, modifications, and variations that fall within the scope of this application, including the appended claims.

What is claimed is:

1. An integrated circuit (IC) comprising:

a first metal layer that provides a signal layer;

a second metal layer located above and spaced apart from the first metal layer by a gap, the second metal layer forming an upper ground plane; and a third metal layer located below and spaced apart from the first metal layer by a gap, the third metal layer forming a lower ground plane, the lower ground plane comprising a solid continuous structure, wherein a meshed signal line comprising one or more holes is disposed in the first metal layer, the meshed signal line being configured to transmit a received signal between circuits on the IC, wherein the upper ground plane overlaps the meshed signal line, and wherein the lower ground plane overlaps the meshed signal line.

2. The IC of claim 1, wherein dimensions of the one or more holes of the meshed signal line are smaller than a wavelength of the received signal transmitted through the meshed signal line.

3. The IC of claim 1, wherein a dielectric layer disposed between the first metal layer and the second metal layer form the gap.

4. The IC of claim 1, wherein bump bonds or posts coupling the first metal layer to the second metal layer define the gap.

5. The IC of claim 1, wherein the upper ground plane is a meshed upper ground plane comprising one or more holes aligned with the one or more holes of the meshed signal line.

6. The IC of claim 1, wherein the upper ground plane comprises a solid continuous structure.

7. The IC of claim 1, wherein the lower ground plane is a meshed lower ground plane comprising one or more holes aligned with the one or more holes of the meshed signal line.

8. The IC of claim 1, wherein the ground plane forms a lower ground plane with the second metal layer being located below the first metal layer and wherein the lower ground plane overlaps the meshed signal line.

9. The IC of claim 8, wherein the lower ground plane is a meshed lower ground plane comprising one or more holes aligned with the one or more holes of the meshed signal line.

10. The IC of claim 8, wherein the lower ground plane comprises a solid continuous structure.

11. The IC of claim 1, wherein the first metal layer and the second metal layer are formed from superconductor materials.

12. An electronic device comprising:

a first metal layer that provides a signal layer; and a second metal layer spaced apart from the first metal layer by a gap, the second metal layer providing a meshed ground plane;

wherein a meshed signal line comprising one or more holes is disposed in the first metal layer, the meshed signal line being configured to transmit a received signal between circuits of the electronic device; and wherein dimensions of the one or more holes of the meshed signal line are smaller than a wavelength of the received signal transmitted through the meshed signal line.

13. The electronic device of claim 12, wherein the meshed ground plane forms a meshed upper ground plane with the second metal layer being located above the first metal layer and wherein the meshed upper ground plane overlaps the meshed signal line.

14. The electronic device of claim 13, wherein the meshed upper ground plane comprises one or more holes aligned with the one or more holes of the meshed signal line.

15. The electronic device of claim 12, wherein the meshed ground plane forms a meshed lower ground plane with the second metal layer being located below the first metal layer and wherein the meshed lower ground plane overlaps the meshed signal line.

16. The electronic device of claim 15, wherein the meshed lower ground plane comprises one or more holes aligned with the one or more holes of the meshed signal line.

17. The electronic device of claim 12, wherein the first metal layer and the second metal layer are formed from superconductor materials.

* * * * *